(12) United States Patent
Duncombe et al.

(10) Patent No.: US 6,255,122 B1
(45) Date of Patent: *Jul. 3, 2001

(54) AMORPHOUS DIELECTRIC CAPACITORS ON SILICON

(75) Inventors: Peter Richard Duncombe; Robert Benjamin Laibowitz, both of Peekskill, NY (US); Deborah Ann Neumayer, Danbury, CT (US); Thomas McCarroll Shaw, Peekskill, NY (US)

(73) Assignee: International Business Machines Corporation, Armonk, NY (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/300,185

(22) Filed: Apr. 27, 1999

(51) Int. Cl.$^7$ ..................................................... H01L 21/00
(52) U.S. Cl. ........................ 438/3; 438/392; 438/511
(58) Field of Search ........................... 438/240, 3, 393, 438/482, 511

(56) References Cited

U.S. PATENT DOCUMENTS

| | | | |
|---|---|---|---|
| 5,624,864 | 4/1997 | Arita et al. | 438/3 |
| 5,658,820 | 8/1997 | Chung | 438/3 |
| 5,702,970 | 12/1997 | Choi | 438/3 |
| 5,716,875 | 2/1998 | Jones, Jr. et al. | 438/3 |
| 5,736,422 | 4/1998 | Lee et al. | 438/3 |
| 5,784,310 | 7/1998 | Cuchiaro et al. | 365/145 |
| 5,812,442 | 9/1998 | Yoo | 365/145 |
| 5,821,005 | 10/1998 | Kijima et al. | 428/701 |
| 5,822,239 | 10/1998 | Ishihara et al. | 365/145 |
| 5,877,053 | * 3/1999 | Wu | 438/254 |
| 5,903,023 | * 5/1999 | Hoshi | 257/300 |

FOREIGN PATENT DOCUMENTS 883 167 A2   12/1998   (EP) .

OTHER PUBLICATIONS

Eguchi et al., "Low Temperature (Ba,Sr)TiO3 Capacitor Process Integration (LTB) Technology for Gigabit Scaled DRAMS", IEDM Technical Digest, 1999, pp. 789–792.*

J.R. McBride, et al., "Growth and Characterization of Relatively Sputtered Thin–Film Platinum Oxides," J. Appl. Phys., vol. 69, No. 3, pp. 1596–1604 (1991).

J.–H. Joo, et al., "Improvement of Leakage Currents of Pt/(Ba, Sr) TiO3/Pt Capacitors," Appl. Phys. Lett., vol. 70, No. 22, pp. 3053–3055 (1997).

Y. Abe, et al., "Preparation of Oxygen–Containing Pt and Pt Oxide Thin Films by Reactive Sputtering and Their Characterization," Jpn. J. Appl. Phys., vol. 37, No. 8, pp. 4482–4480 (1998).

Y. Tsunemine, et al., "A Manufacturable Integration Technology of Sputter–BST Capacitor With a Newly Proposed Thick Pt Electrode," Paper 30–3, IEDM (Dec. 1998).

* cited by examiner

*Primary Examiner*—Charles Bowers
*Assistant Examiner*—William M. Brewster
(74) *Attorney, Agent, or Firm*—Scully, Scott, Murphy & Presser; Robert M. Trepp

(57) ABSTRACT

High-capacity capacitors and gate insulators exhibiting moderately high dielectric constants with surprisingly low leakage using amorphous or low temperature films of perovskite type oxides including a titanate system material such as barium titanate, strontium titanate, barium strontium titanate (BST), lead titanate, lead zirconate titanate, lead lanthanum zirconate titanate, barium lanthanum titanate, a niobate, aluminate or tantalate system material such as lead magnesium niobate, lithium niobate lithium tantalate, potassium niobate and potassium tantalum niobate, a tungsten-bronze system material such as barium strontium niobate, lead barium niobate, barium titanium niobate, and Bi-layered perovskite system material such as strontium bismuth tantalate, bismuth titanate deposited directly on a silicon surface at temperatures about 450° C. or less.

26 Claims, 1 Drawing Sheet

AMORPHOUS DIELECTRIC CAPACITORS ON SILICON

DESCRIPTION

1. Field of the Invention

The present invention relates to high-capacitance capacitors, and more particular to an amorphous (or low temperature) phase of a high dielectric constant thin film material which can be employed as a dielectric in capacitors formed directly on silicon. Such structures will be useful as capacitors in dynamic random access memory (DRAM) applications, gate dielectrics in transistors and as decoupling capacitors. The present invention also relates to a gate dielectric material, and more particular to an amorphous (or low temperature) phase high dielectric constant thin film material which can be employed as a gate dielectric in a transistor.

2. Background of the Invention

Dielectric materials in high density circuits appear as capacitors in dynamic random access memory (DRAM) applications, gate dielectrics in transistors and as decoupling capacitors. The dielectric materials in these structures are typically silicon dioxide ($SiO_2$), silicon nitride ($Si_3N_4$), aluminum oxide ($Al_2O_3$) or any combination thereof. These dielectric materials typically have a dielectric constant of 9.0 or below. As today's generation of circuits become smaller and smaller, the dielectric materials employed therein must be made thinner to satisfy circuit requirements. The use of thin, low dielectric constant materials in today's circuits is undesirable since such materials lead to leaky circuits. Thus, it would be beneficial if the dielectric constant of the dielectric material used in such circuits could be increased.

A variety of high dielectric constant materials such as the crystalline form of perovskite-type oxides including a titanate system material such as barium titanate, strontium titanate, barium strontium titanate (BST), lead titanate, lead zirconate titanate, lead lanthanum zirconate titanate, barium lanthanum titanate, barium zirconium titanate; an aluminate such as lanthanum aluminate and yttrium aluminate; a niobate or tantalate system material such as lead magnesium niobate, lithium niobate, lithium tantalate, potassium niobate, strontium aluminum tantalate and potassium tantalum niobate; a tungsten-bronze system material such as barium strontium niobate, lead barium niobate, barium titanium niobate; and Bi-layered perovskite system material such as strontium bismuth tantalate, bismuth titanate are known in the art. Despite having dielectric constants of about 200 or more, crystalline perovskite-type oxides are deposited at temperatures of about 500° C. or more. At such high temperatures, if deposited directly on silicon, interfacial layers form which may degrade device performance. In addition, grain boundary leakage paths and lowered barrier heights may result which could lead to high device leakage.

In view of the drawbacks with prior art dielectric materials, it would be beneficial if a new dielectric material was developed which could be directly deposited on silicon. This new dielectric material must exhibit low leakage as compared to dielectric materials presently employed in this field and must have a dielectric constant that is about 10 or above.

SUMMARY OF THE INVENTION

One object of the present invention is to provide a thin film dielectric material which can be employed in forming capacitors on silicon or as a gate dielectric material.

Another object of the present invention is to provide a thin film dielectric material which has a dielectric constant higher than conventional dielectric materials such as $SiO_2$ ($\in$=4), $Si_3N_4$ ($\in$=7), and $Al_2O_3$ ($\in$=8) and which is compatible with CMOS (complimentary metal oxide semiconductor) processing.

A further object of the present invention is to provide a thin film dielectric material which exhibits good conformity to the electrode material to which it is applied as well as a low leakage current that is on the order of 1 $A/cm^2$ or less, preferably $1 \times 10^{-4}$ $A/cm^2$ or less.

These and other objects and advantages are achieved in the present invention by utilizing an amorphous (or low temperature) phase material as a thin film dielectric material. Specifically, one embodiment of the present invention relates to high-capacitance capacitors (on the order of 1 $nF/mm^2$ or above) formed using thin films of materials which are in the amorphous (or low temperature) phase. Such dielectric materials can be formed directly on top of silicon minimizing the formation of any interfacial layers or grain boundaries which can lead to device degradation.

Another embodiment of the present invention relates to a gate electrode insulator which comprises a thin film of an amorphous (or low temperature) phase material as the gate dielectric material in a transistor.

In the latter stages of CMOS processing and in applications such as BEOL structures and organic FETs, ambient temperatures must be kept low, less than 500° C., thus the novel capacitors and transistors of the present invention use a low temperature deposition and annealing process to stay at or below this temperature. These low temperature processes ensure formation of a dielectric material which is in the amorphous (or low temperature) phase. For example, it has been determined that the low temperature (or amorphous) phase of barium strontium titanate has a dielectric constant of up to about 25 which value is significantly higher than that of the typical dielectrics used in circuit applications. Other perovskite-type oxides such as lead lanthanum titanate can have even greater dielectric constants in their amorphous phase. Capacitors and transistors formed utilizing these particular types of low temperature dielectrics also exhibit low leakage and good conformability.

More specifically, the present invention provides an amorphous thin film dielectric material having a dielectric constant greater than 10 that may be used in fabricating high-capacity capacitors or gate insulators. The term "amorphous" is used herein to denote a material which lacks an ordered crystal structure. This is different from the crystalline phase of the material wherein a highly ordered crystal structure is observed.

In general the structures of the present invention comprise at least an amorphous or low temperature phase dielectric material which is selected from the group consisting of a perovskite-type oxide such as a titanate system material, i.e. barium titanate, strontium titanate, barium strontium titanate, lead titanate, lead zirconate titanate, lead lanthanum zirconate titanate, barium zirconium titanate and barium lanthanum titanate; an aluminate such as lanthanum aluminate and yttrium aluminate; a niobate or tantalate system material such as lead magnesium niobate, lithium niobate, lithium tantalate, potassium niobate, strontium aluminum tantalate and potassium tantalum niobate; a tungsten-bronze system material such as barium strontium niobate, lead barium niobate, and barium titanium niobate; or a Bi-layered perovskite system material such as strontium bismuth tantalate, and bismuth titanate as the dielectric material. The amorphous phase dielectric material of the present invention is formed using low temperature deposition and annealing steps wherein the temperature of both steps is about 450° C. or less.

The capacitor of the present invention is prepared using the following steps:

(a) preparing a bottom semiconducting electrode, said semiconducting electrode being composed of a semiconducting material such as silicon, a silicon containing material, a semiconducting organic or inorganic material;

(b) forming an amorphous (or low temperature) phase high dielectric constant material ($\in$=10 or above) on top of the bottom semiconducting electrode;

(c) annealing the amorphous dielectric material at a temperature which is effective in improving the quality as well as the dielectric constant of the amorphous dielectric material; and (d) fabricating a top conductive electrode on said annealed dielectric material.

In an optional embodiment of the present invention, the above described method further comprises: (e) applying a passivation coating to said top conductive electrode.

In another aspect of the present invention, a transistor comprising the amorphous high dielectric constant material of the present invention is prepared using the following processing steps:

(a) forming an amorphous high dielectric constant material on a structure consisting of a semiconducting electrode such as Si;

(b) annealing the amorphous high dielectric constant material at a temperature which is effective in improving the quality as well as the dielectric constant of the amorphous dielectric material; and (c) forming a gate conductor on said annealed dielectric material.

In an optional embodiment of this method, a passivating coating is formed on said gate conductor.

DETAILED DESCRIPTION OF THE INVENTION

Figure 1:
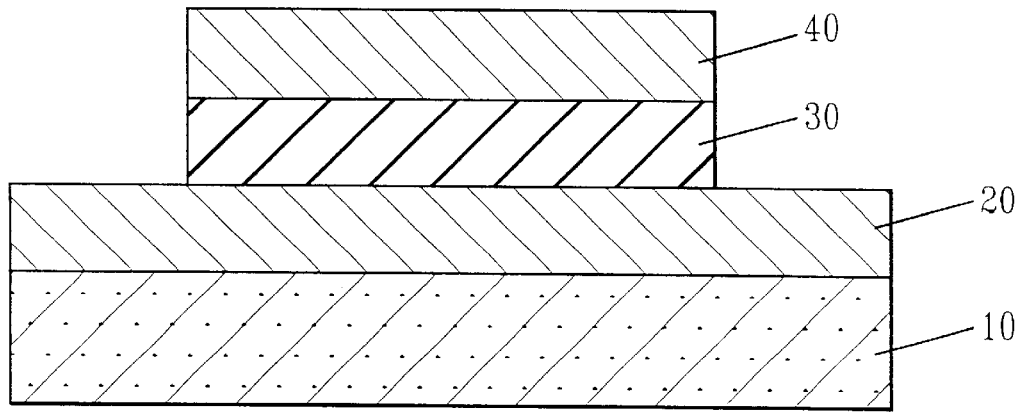
FIG. 1 is a cross-sectional view of a capacitor of the present invention, wherein an amorphous (or low temperature) phase high dielectric constant material is employed as a capacitive element.

The present invention which provides an amorphous thin film dielectric material having a dielectric constant greater than 10 for use in fabricating high-capacity capacitors or gate insulators will now be described in greater detail by referring to the drawings that accompany the present application. It is noted that in the drawings like reference numerals are used for describing like and/or corresponding elements.

FIG. 1 is a cross-sectional view of a capacitor of the present invention, wherein an amorphous (or low temperature) phase high dielectric constant material 30 is sandwiched between a top conductive electrode 40, e.g. a noble metal, a noble metal oxide, a conductive oxide or a combination thereof, and a bottom Si-containing electrode 20, e.g. heavily doped polysilicon, on a silicon wafer 10. Other semiconductors are also possible.

Figure 2:
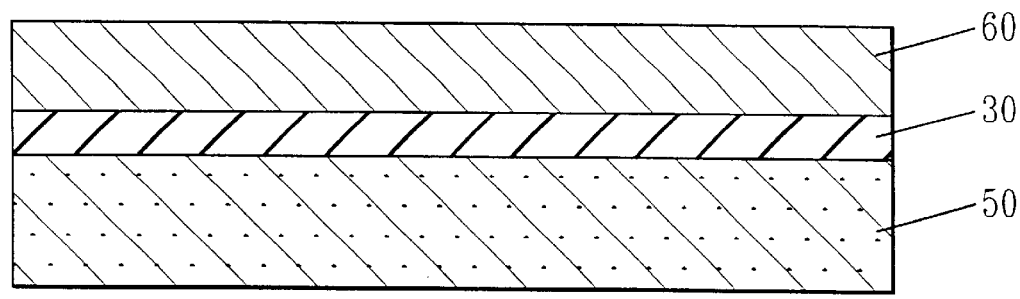
FIG. 2 is a cross-sectional view of the gate region of a transistor of the present invention, wherein an amorphous phase high dielectric constant material is used as the gate insulator.

FIG. 2, on the other hand, is a cross-sectional view of the gate area of a transistor of the present invention. Specifically the gate structure shown in FIG. 2 comprises a bottom semiconducting electrode 50, and amorphous phase high dielectric constant material 30 formed on said semiconducting electrode and a gate electrode formed on said amorphous phase high dielectric constant material. The semiconducting electrode can be a material such as silicon, a silicon containing material, a semiconducting organic or inorganic material and it can be made conductive either by doping or by the application of an electric field. The gate electrode is one of the conductive materials described above for top conductive electrode 40 or doped polysilicon. Although not shown in either figure, a passivating coating comprising a conventional inorganic or organic dielectric material-may be formed over the top layer, i.e. top conductive electrode 40 or gate conductor 60.

The structures shown in FIGS. 1 and 2 are composed of conventional materials that are well known to those skilled in the art; the exception being the amorphous phase high dielectric constant material. These structures are also formed using conventional methods that are well known in the art; again the exception being the fabrication of the amorphous phase high dielectric constant material. Detailed descriptions concerning the conventional materials and processing steps are thus not needed herein. Instead, the remaining description of this application focuses on the amorphous phase high dielectric constant material and how the same is fabricated.

The amorphous phase high dielectric constant thin film material of the present invention is composed of a perovskite-type metal oxide film which is a material that includes one acidic oxide containing at least one metal selected from Group IVB (Ti, Zr or Hf), Vb (V, Nb or Ta), VIB (Cr, Mo or W), VIIB (Mn or Re), IIIA (Al, Ga or In) or IB (Cu, Ag or Au) of the Periodic Table of Elements (CAS version) and at least one additional cation having a positive formal charge of from about 1 to about 3. Such perovskite-type oxides typically, but not always, have the basic formula: $ABO_3$, wherein A is one of the above mentioned cations and B is one of the above mentioned metals.

Suitable perovskite-type oxides that can be employed in the present invention include, but are not limited to: a titanate system material such as barium titanate, strontium titanate, barium strontium titanate, lead titanate, lead zirconate titanate, lead lanthanum zirconate titanate, barium lanthanum titanate and barium zirconium titanate; an aluminate such as lanthanum aluminate and yttrium aluminate; a niobate or tantalate system material such as lead magnesium niobate, lithium niobate, lithium tantalate, potassium niobate, strontium aluminum tantalate and potassium tantalum niobate; a tungsten-bronze system material such as barium strontium niobate, lead barium niobate, barium titanium niobate; and a Bi-layered perovskite system material such as strontium bismuth tantalate, and bismuth titanate.

The perovskite-type oxides employed in the present invention must be in the amorphous or low temperature phase and are formed by a suitable deposition process which is capable of operating at temperatures below the crystallization temperature of the perovskite-type oxide. Typically the deposition temperature is kept about 450° C. or less.

Suitable deposition processes that can be employed in the present invention in forming the amorphous or low temperature phase thin film dielectric material include, but are not limited to: chemical vapor deposition (CVD) processes such as plasma assisted CVD, low pressure CVD, high density plasma CVD, as well as chemical solution deposition (CSD) processes including metal organic decomposition, sol-gel, and physical vapor deposition (PVD) processes including evaporation, sputtering, and pulsed laser deposition.

A detailed description of materials used in forming the amorphous phase high dielectric constant material of the present invention is found in copending and coassigned U.S. patent application Ser. No. 09/225,526, filed Jan. 4, 1999, the contents of which are being incorporated herein by reference. It is noted that the amorphous dielectric material of the present invention may comprise a single oxide material or it may comprise a multi-oxide composition.

A post deposition annealing step may be employed in forming the amorphous or low temperature phase thin film dielectric material of the present invention. The annealing step used in forming the amorphous or low temperature phase thin film dielectric material is conducted at a temperature which is effective in improving the quality of the deposited film as well as enhancing the dielectric constant of the same. Specifically, annealing is carried out a temperature of from about 150° C. to about 450° C. for about 0.1 to 3 hours. More preferably, annealing is carried out at a temperature of from about 300° C. to about 400° C. for a time period of from about 0.2 to 2 hours. Oxidizing gases such as oxygen, $N_2O$, and $O_3$, or mixtures of oxidizing gases alone or with an inert gas such as air are typically employed in the annealing step.

The exact conditions employed in forming the amorphous or low temperature thin film dielectric material may, however, vary depending on the specific technique employed. The only critical limitation is that the deposition and annealing temperatures be below the crystalline temperature of the perovskite-type oxide.

The term "thin film" is used herein to denote that the deposition process provides a highly conformal layer of the amorphous or low temperature phase of the perovskite-type oxide which ranges from about 15 to about 2000 nm. More preferably, the thickness of the amorphous or low temperature thin film dielectric material of the present invention is in the range of from about 1 to about 200 nm.

As stated above, the dielectric constant, $\in$, of the amorphous or low temperature thin film dielectric material of the present invention is about 10 or greater. More preferably, the amorphous or low temperature thin film dielectric material of the present invention has a dielectric constant of from about 10 to about 50. Although the dielectric constants of the amorphous or low temperature thin film dielectric material of the present invention are lower than the corresponding crystalline phase of the material, the amorphous or low temperature thin film dielectric material of the present invention have dielectric constants which are significantly higher than the typical nitrides and oxides of silicon that are used in most integrated circuits.

The following example is given to illustrate the scope of the present application. Because this example is given for illustrative purposes only, the invention embodied therein should not be limited thereto.

EXAMPLE

An example of the fabrication of amorphous or low temperature thin film dielectric material of the present invention by chemical solution deposition is given below.

Under nitrogen with stirring, 0.035 mole barium methoxyethoxide, 0.015 mole strontium methoxyethoxide, and 0.050 mole titanium methoxyethoxide were dissolved together in 2-methoxyethanol. The solution was stirred overnight at room temperature, filtered and diluted to the mark in a 250 ml volumetric flask. A spin solution was prepared by diluting 1 part $Ba_{0.7}Sr_{0.3}Ti$ methoxyethoxide stock solution with one part isopropanol.

The spin solution was loaded into a syringe and a 0.45 $\mu$m and 0.1 $\mu$m Whatman syringe filters were attached. The solution was syringed onto a heavily-doped p-type boron doped silicon substrate until the substrate was completely wetted. The substrate was then spun for 30 sec at 2500 rpm. The coated substrate was baked in an oxygen atmosphere in a furnace at 400° C. for 5–10 min. The process was repeated to fabricate a two layer and three layer film.

A Pt top electrode was then deposited by evaporation on top of the amorphous barium strontium titanate. The resultant 45 nm thick two layer film had a dielectric constant of 13 with a leakage current of $10^{-5}$ $A/cm^2$ at 1 Volt. The resultant three layer 77 nm thick film had a dielectric constant of 19 with a leakage current of $10^{-7}$ $A/cm^2$ at 1 Volt. A two layer film was fabricated following the above procedure except the coated substrate was baked in an oxygen atmosphere in an oven at 400° C. for 30 min. The resultant 580 nm thick film had a dielectric constant of 21 with a leakage current of $10^{-6}$ $A/cm^2$ at 1 Volt.

While the invention has been particularly shown and described with respect to preferred embodiments thereof, it will be understood by those skilled in the art that the foregoing and other changes in form and detail may be made without departing from the spirit and scope of the invention.

Having thus described our invention, what we claim as new and desire to secure by the Letter Patent is:

1. A capacitor comprising an amorphous dielectric having a dielectric constant of 10 or greater deposited directly on a silicon-containing electrode, wherein said amorphous dielectric material is formed under conditions that minimize formation of any interfacial layers or grain boundaries on said silicon-containing substrate.

2. The capacitor of claim 1 wherein the amorphous dielectric material is fabricated at temperatures about 450° C. or less.

3. The capacitor of claim 1 wherein the amorphous dielectric material is a thin film having a thickness of from about 1 to about 2000 nm.

4. The capacitor of claim 1 wherein said amorphous dielectric material is a perovskite-type oxide having the formula $ABO_3$, wherein B is at least one acidic oxide containing a metal from Group IVB, VB, VIB, VIIB, IIIA and IB of the Periodic Table of Elements and A is at least one additional cation having a positive formal charge of from about 1 to about 3.

5. The capacitor of claim 4 wherein said amorphous dielectric material is a titanate, niobate, aluminate or tantalate system material, a tungsten-bronze system material or a Bi-layered system material.

6. The capacitor of claim 5 wherein said amorphous dielectric material is barium strontium titanate, barium titanate, strontium titanate, lead zirconium titanate, barium zirconium titanate, tantalum titanate, lead lanthanum titanate, barium strontium niobate, barium lanthanum titanate, lanthanum aluminate, yttrium aluminate, strontium aluminum tantalate or barium titanium niobate.

7. The capacitor of claim 6 wherein said amorphous dielectric is barium strontium titanate.

8. The capacitor of claim 1 wherein a top conductive electrode is formed on said amorphous dielectric material.

9. The capacitor of claim 8 wherein said top conductive electrode is composed of a conductive material selected from the group consisting of a noble metal, a noble metal oxide, a conductive oxide and mixtures thereof.

10. The capacitor of claim 8 wherein a passivating layer is formed on said top conductive electrode.

11. A method for forming a capacitor comprising an amorphous dielectric material having a dielectric constant of 10 or greater deposited directly on a silicon-containing material comprising the steps of:

(a) preparing a bottom electrode, said bottom electrode being composed of Si or a Si-containing material;

(b) forming an amorphous dielectric material on top of the bottom electrode;

(c) annealing the amorphous dielectric material at a temperature which is effective in improving the quality as well as the dielectric constant of the amorphous dielectric material; and (d) fabricating a top conductive electrode on said annealed amorphous dielectric material.

12. The method of claim 11 wherein steps (b) and (c) are carried out at temperatures of about 450° C. or less.

13. The method of claim 11 wherein step (b) is carried out by chemical vapor deposition, plasma assisted chemical vapor deposition, low pressure chemical vapor deposition, high density plasma chemical vapor deposition, metal organic decomposition, sol-gel, evaporation, sputtering, or pulsed laser deposition.

14. The method of claim 11 further comprising (e) forming a passivating layer on said top conductive electrode.

15. A gate insulator for use in a transistor comprising an amorphous dielectric material having a dielectric constant of 10 or greater.

16. The gate insulator of claim 15 wherein the amorphous dielectric material is fabricated at temperatures about 450° C. or less.

17. The gate insulator of claim 15 wherein the amorphous dielectric material is a thin film having a thickness of from about 1 to about 2000 nm.

18. The gate insulator of claim 15 wherein said amorphous dielectric material is a perovskite-type oxide having the formula $ABO_3$ wherein B is at least one acidic oxide containing a metal from Group IVB, VB, VIB, VIIB, IIIA and IB of the Periodic Table of Elements and A is at least one additional cation having a positive formal charge of from about 1 to about 3.

19. The gate insulator of claim 18 wherein said amorphous dielectric material is a titanate, niobate, aluminate or tantalate system material, a tungsten-bronze system material or a Bi-layered system material.

20. The gate insulator of claim 19 wherein said amorphous dielectric material is barium strontium titanate, barium titanate, strontium titanate, lead zirconium titanate, barium zirconium titanate, tantalum titanate, lead lanthanum titanate, barium strontium niobate, barium lanthanum titanate, lanthanum aluminate, yttrium aluminate, strontium aluminum tantalate or barium titanium niobate.

21. The gate insulator of claim 20 wherein said amorphous dielectric material is barium strontium titanate.

22. A method of fabricating a transistor comprising an amorphous dielectric constant material as a gate insulator comprising the steps of:

(a) forming an amorphous dielectric material on a structure containing a semiconducting electrode, said amorphous dielectric material having a dielectric constant of 10 or above;

(b) annealing the amorphous dielectric material at a temperature which is effective in improving the quality as well as the dielectric constant of the amorphous dielectric material; and (c) forming a gate conductor on said annealed amorphous dielectric material.

23. The method of claim 22 wherein steps (a) and (b) are carried out at temperatures of about 450° C. or less.

24. The method of claim 22 wherein step (a) is carried out by chemical vapor deposition, plasma assisted chemical vapor deposition, low pressure chemical vapor deposition, high density plasma chemical vapor deposition, metal organic decomposition, sol-gel, evaporation, sputtering, or pulsed laser deposition.

25. The method of claim 22 further comprising (d) forming a passivating layer on said gate conductor.

26. The method of claim 22 wherein said semiconducting electrode is silicon, a silicon containing material, a semiconducting organic or inorganic material.

* * * * *

UNITED STATES PATENT AND TRADEMARK OFFICE
CERTIFICATE OF CORRECTION

PATENT NO. : 6,255,122 B1
DATED : July 3, 2001
INVENTOR(S) : Peter R. Duncombe et al.

Page 1 of 1

It is certified that error appears in the above-identified patent and that said Letters Patent is hereby corrected as shown below:

<u>Title page,</u>
Item [56] References Cited, OTHER PUBLICATIONS,
"DRAMS" should read -- DRAMs --

<u>Columns 7 and 8,</u>
Lines 7 through 42, delete Claims 11 through 26.

Signed and Sealed this

Sixteenth Day of April, 2002

Attest:

Attesting Officer

JAMES E. ROGAN
*Director of the United States Patent and Trademark Office*